United States Patent
Hasbun et al.

[11] Patent Number: 5,936,884
[45] Date of Patent: *Aug. 10, 1999

[54] MULTIPLE WRITES PER A SINGLE ERASE FOR A NONVOLATILE MEMORY

[75] Inventors: Robert N. Hasbun, Shingle Springs, Calif.; Frank P. Janecek, London, United Kingdom

[73] Assignee: Intel Corporation, Santa Clara, Calif.

[*] Notice: This patent issued on a continued prosecution application filed under 37 CFR 1.53(d), and is subject to the twenty year patent term provisions of 35 U.S.C. 154(a)(2).

[21] Appl. No.: 08/685,939

[22] Filed: Jul. 22, 1996

Related U.S. Application Data

[63] Continuation-in-part of application No. 08/537,132, Sep. 29, 1995, Pat. No. 5,815,434.

[51] Int. Cl.$^6$ ................................................ G11C 11/34
[52] U.S. Cl. ............... 365/185.03; 365/168; 365/185.29; 365/185.3
[58] Field of Search .................. 365/185.03, 218, 365/168, 185.29, 185.3

[56] References Cited

U.S. PATENT DOCUMENTS

| | | | |
|---|---|---|---|
| 4,202,044 | 5/1980 | Beilstein, Jr. et al. | 365/182 |
| 4,287,570 | 9/1981 | Stark | 365/104 |
| 4,388,702 | 6/1983 | Sheppard | 365/104 |
| 4,415,992 | 11/1983 | Adlhoch | 365/94 |
| 4,586,163 | 4/1986 | Koike | 365/104 |
| 4,653,023 | 3/1987 | Suzuki et al. | 365/104 |
| 4,701,884 | 10/1987 | Aoki et al. | 365/189.09 |
| 4,709,350 | 11/1987 | Nakagome et al. | 365/45 |
| 4,771,404 | 9/1988 | Mano et al. | 365/189.07 |
| 4,964,079 | 10/1990 | Devin | 365/185.03 |
| 5,012,448 | 4/1991 | Matsuoka et al | 365/208 |
| 5,043,940 | 8/1991 | Harari | 365/168 |
| 5,163,021 | 11/1992 | Mehrotra et al. | 365/185.03 |
| 5,172,338 | 12/1992 | Mehrotra et al. | 365/185.03 |
| 5,262,984 | 11/1993 | Noguchi et al. | 365/185.03 |
| 5,293,560 | 3/1994 | Harari | 365/185.03 |
| 5,297,148 | 3/1994 | Harari et al. | 371/10.2 |
| 5,351,210 | 9/1994 | Saito | 365/189.01 |
| 5,422,845 | 6/1995 | Ong | 365/185.18 |
| 5,440,505 | 8/1995 | Fazio et al. | 365/45 |
| 5,450,363 | 9/1995 | Christopherson et al. | 341/98 |
| 5,487,033 | 1/1996 | Keeney et al. | 365/185.19 |
| 5,497,119 | 3/1996 | Tedrow et al. | 327/540 |
| 5,515,317 | 5/1996 | Wells et al. | 395/427 |
| 5,539,690 | 7/1996 | Talreja et al. | 365/185.22 |
| 5,546,042 | 8/1996 | Tedrow et al. | 327/538 |
| 5,553,020 | 9/1996 | Keeney et al. | 365/185.19 |
| 5,566,125 | 10/1996 | Fazio et al. | 365/45 |
| 5,570,315 | 10/1996 | Tanaka et al. | 365/185.03 X |
| 5,594,691 | 1/1997 | Bashir | 365/185.03 |
| 5,682,347 | 10/1997 | Hazama | 365/185.22 |

*Primary Examiner*—David Nelms
*Assistant Examiner*—Hoai V. Vo
*Attorney, Agent, or Firm*—Blakely, Sokoloff, Taylor & Zafman LLP

[57] ABSTRACT

A method of performing multiple writes before erasing a memory cell is described. M bits are stored in a first group of levels of the memory cell. M subsequent superseding bits are stored in a second group of levels of the memory cell without erasing the memory cell. Another method of writing to a memory cell includes the step of storing m bits in a first group of levels of the memory cell. A group indicator is adjusted to identify a subsequent group of levels of the memory cell. Next, m superseding subsequent bits are stored in the subsequent group of levels, without erasing the memory cell. The steps of adjusting the group indicator and storing m superseding subsequent bits are repeated. A method of deferring an erase for a memory cell is also described. A group indicator is adjusted to identify a group of $2^m$ adjacent levels of the memory cell available for storing an m bit value. A method of reading a memory cell includes providing a group indicator. The group indicator identifies a group of $2^m$ adjacent levels of the memory cell. An m bit value is then read by sensing the group of $2^m$ adjacent levels identified by the group indicator.

19 Claims, 6 Drawing Sheets

MULTIPLE WRITES PER A SINGLE ERASE FOR A NONVOLATILE MEMORY

CROSS-REFERENCE TO RELATED APPLICATIONS

This application is a continuation-in-part of application No. 08/537,132 of Hasbun, et al. U.S. Pat. No. 5,815,434 which was filed on Sep. 29, 1995.

FIELD OF THE INVENTION

This invention pertains to the field of memory circuitry. In particular, this invention pertains to performing multiple write operations without an erase operation in an electrically programmable nonvolatile memory.

BACKGROUND OF THE INVENTION

Semiconductor memory devices typically consist of a number of individual cells for storing data. In a conventional binary memory device, each cell can store one of two states to represent one bit of data. Alternatively, each memory cell might store more than one bit of data. Such memory devices are referred to as multi-level or multi-bit memory devices. Multi-level memory devices increase the storage capacity and density over conventional binary devices. For example, a memory device capable of storing two bits of data per cell has a capacity to store twice the data than can be stored in the same number of conventional binary memory device.

The programming of conventional binary memory devices consists of storing or programming one of two levels or states in a memory cell to represent all the possible values for one bit of data. For example, a conventional memory cell, when accessed during a write operation, stores a first voltage or threshold level to represent a first state and stores a second voltage or threshold level to represent the second state. In a multi-level memory device, however, typically one of n states is stored to represent more than a single bit of data. Although the ability to store a single bit requires the ability to store at least two levels as in the prior art binary memory cells, "multi-level" as used here is intended to refer to a cell capable of storing one of more than two levels or states (i.e., more than one binary digit), and "binary" refers to a cell capable of storing one of only two levels (i.e., one binary digit). For example, in order to store two bits in each multi-level memory cell, each cell must be capable of storing one of at least four levels. A multi-level cell capable of storing n bits, must be able to support $2^n$ threshold levels because each bit can have one of two levels.

One type of multi-level memory cell is a flash multi-level memory cell. In general, flash memory cells include a floating gate field effect transistor. Each floating gate transistor has a select gate, a floating gate, a source, and a drain. Information is stored in the flash cell by altering the amount of charge stored on the floating gate. This in turn causes the threshold voltage, $V_t$, of the floating gate field effect transistor to be varied. The typical prior art binary flash memory cell can be in one of two possible states, being either "programmed" or "erased". Theoretically, the flash cell possesses a distinct state for each electron that is added to the floating gate. Practically however, prior art flash cells have a limited number of states due to constraints including inconsistencies in flash cell structure, charge loss over time, and limitations in sensing the charge stored on the floating gate.

The actual charge stored on a programmed cell may vary from one programmed cell to another programmed cell or from one erased cell to another erased cell. In order to accommodate this factor, the binary flash cell is interpreted as storing a "1" if $V_t$ is within a first range of values and a "0" if $V_t$ is within a second range of values. The first and second ranges are distinct and may be separated by a "separation range". In other words, if the threshold voltage, $V_t$, is programmed to a value within one set of values, the cell state is a "1". If the threshold voltage, $V_t$, is programmed to a value within another set of values, the cell state is a "0". The difference between these sets of values is called the separation range.

When a flash cell is read, the current conducted by the flash cell is compared to a current conducted by a reference flash cell having a threshold voltage, $V_t$, set to a predetermined voltage that lies within the separation range. When a flash cell is selected for reading, a biasing voltage is applied to the select gate of the field effect transistor. Simultaneously, the same biasing voltage is applied to the select gate of the reference cell. If the flash cell is "programmed," excess electrons are trapped on the floating gate, and the threshold voltage, $V_t$ of the flash cell has increased such that the selected flash cell conducts less drain current than the reference flash cell. The programmed state of the prior art binary flash cell is typically associated with a logic 0. If the prior art flash cell is "erased", the floating gate has fewer electrons and the flash cell conducts more drain-to-source current than the reference cell. The erased state of the prior art binary flash cell is usually associated with a logic 1.

Multi-level flash cells are capable of storing one of more than two levels. For example, a multi-level flash cell capable of storing 2 bits can be placed into one of four states. This means that one state is uniquely assigned to one of the four possible combinations of two bits, "00," "01," "10," and "11." $2^n-1$ references are required to distinguish between $2^n$ states. Thus for 4 states, there must be 3 reference voltages and 3 separation ranges. For comparison, the prior art binary flash cell typically uses one reference voltage to distinguish between 2 states.

These multi-level flash cells are read by comparing each of the $2^n-1$ voltage references to a voltage determined by the drain-to-source current of the memory cell. Decoding logic is then used to translate the output of the $2^n-1$ comparators into n bits.

A flash memory device typically includes arrays of flash memory cells. These arrays are typically grouped into or further subdivided into blocks. Prior art flash memory can be programmed cell by cell, however, flash memory can only be erased in blocks of cells.

One disadvantage of the prior art write technique is that once a block has data written to it, the data in that block cannot be modified without erasing the block first. In other words, the prior art write techniques permit only one write cycle for every erase cycle.

One application of flash memory is in the area of solid state "disks". Solid state disks use nonvolatile memory, such as flash memory, to emulate a conventional computer disk storage device. Typically, disk sectors are mapped either physically or logically onto blocks of flash memory cells. Because only one write cycle is possible for each erase cycle in the prior art storage systems a method of "cleaning up" the previously written to cells is necessary in order to make those cells available for data storage again. Typically, the valid data in a block is copied with the updated data to another block location. Then the previous block location is marked for cleanup. The cleanup process erases the entire block and makes the block available for storage again.

One disadvantage of the prior art method of one write for each erase on the cell is the amount of energy consumption required. Thus in applications where the stored data must be modified frequently, considerable amounts of energy are consumed in moving the valid data to a new location and erasing the blocks that the information was previously stored in.

Another disadvantage of performing an erase step in order to reprogram the cells is that the erase process typically takes considerably longer to execute than the programming process.

Another disadvantage of an erase for every programming cycle are the cycling induced reliability errors. The flash memory cells deteriorate with each program/erase cycle.

SUMMARY OF THE INVENTION

In view of limitations of known systems and methods, one of the desires of the present invention is to provide a method of performing multiple superseding writes of m bits to a nonvolatile memory cell without performing an erase. The method includes the steps of storing m bits in a first group of levels of the memory cell and storing m superseding bits in a second group of levels of the memory cell, without erasing the memory cell.

Another method of writing includes the step of storing m bits in a first group of levels of the memory cell. A group indicator is adjusted to identify a subsequent group of levels of the memory cell. Without erasing the memory cell, m superseding subsequent bits are stored in the subsequent group of levels. The steps of adjusting the group indicator and storing m superseding subsequent bits is repeated.

Another desire is to provide a method of reading a memory cell capable of storing up to k superseding m bit values. This method includes the steps of providing a group indicator to identify a group of $2^m$ adjacent levels of the memory cell and sensing the identified group of levels to read an m bit value.

In addition, a method of deferring an erase operation on a nonvolatile memory cell is provided. The erase operation is deferred by adjusting a group indicator, wherein the group indicator identifies $2^m$ adjacent levels of the memory cell for storing an m bit value.

A backfill technique is introduced as a method of ensuring consistent programming times for a given group of levels of the memory cell.

Other desires, features, and advantages will be apparent from the accompanying drawings and from the detailed description that follows below.

BRIEF DESCRIPTION OF THE DRAWINGS

The present invention is illustrated by way of example and not limitation in the figures of the accompanying drawings, in which like references indicate similar elements and in which.

DETAILED DESCRIPTION

By using the multi-level cell as a single bit storage device, a single bit can be written multiple times before an erase occurs. Consider an n-level multi-level flash memory cell. The flash memory cell can have up to n unique levels. One level will be reserved for the erased state. The remaining n−1 levels are available for programming.

During an erase operation charge is removed from the floating gate of the flash memory cells. During a programming operation charge can be placed on the floating gate of the flash memory cells. A programmed or erased state should be contrasted with a program or an erase operation. The programmed state (i.e., placing charge on the floating gate) of the prior art binary flash cell is typically associated with a logic 0 and the erased state (i.e., removing charge from the floating gate) is usually associated with a logic 1. An erase operation is a process of depleting charge from the floating gate. During an erase operation, any charge in excess of a given threshold on the floating gate is drained off to ensure that the charge level on the floating gate is below the threshold level after an erase operation. A programming operation however, may or may not place charge on the floating gate, depending upon the value to be stored. The conventional binary flash cell can always be programmed to a 0 (i.e., have charge placed on the floating gate). After being programmed to a 0, however, an erase operation must be performed before the conventional binary cell can store a 1 again.

In the multi-level cell, instead of storing a single multibit value by selecting a charge level, a single bit could be stored at a given level. In other words, multiple superseding writes to a multi-level memory cell are accomplished by performing the steps of storing (or writing) a first bit at a first level of an n-level multi-level memory cell and then storing a second bit at a second level of the multi-level memory cell. The first value has been overwritten by storing the second bit at the second level. In essence, this permits multiple writes to the multi-level cell before an erase operation is required.

In order to determine the value stored in a given cell, it is necessary to know what the last level written to was. This means that a tracking mechanism is required to keep track of the current level (or the proper reference voltage to use). This mechanism might comprise a state machine, a memory, or a counter. The degree to which tracking is performed (i.e., cell by cell, block, groups of blocks, or device levels) is referred to as the tracking resolution. In one embodiment, the tracking mechanism is implemented on a cell by cell basis. Tracking on a cell by cell basis might be inefficient however due to practical considerations in implementing the tracking mechanism. Furthermore, because all flash cells within the block must be erased in order to erase one flash cell within the block anyway, tracking might prove to be most efficient at the block or even the device level. Therefore, alternative embodiments use a block, multiple cell, or device level tracking resolution. Multiple cell tracking might be useful, for example, in a solid state disk application where disk sectors are logically mapped to a number of cells physically arranged as a subset of cells within a block of cells.

Figure 1:
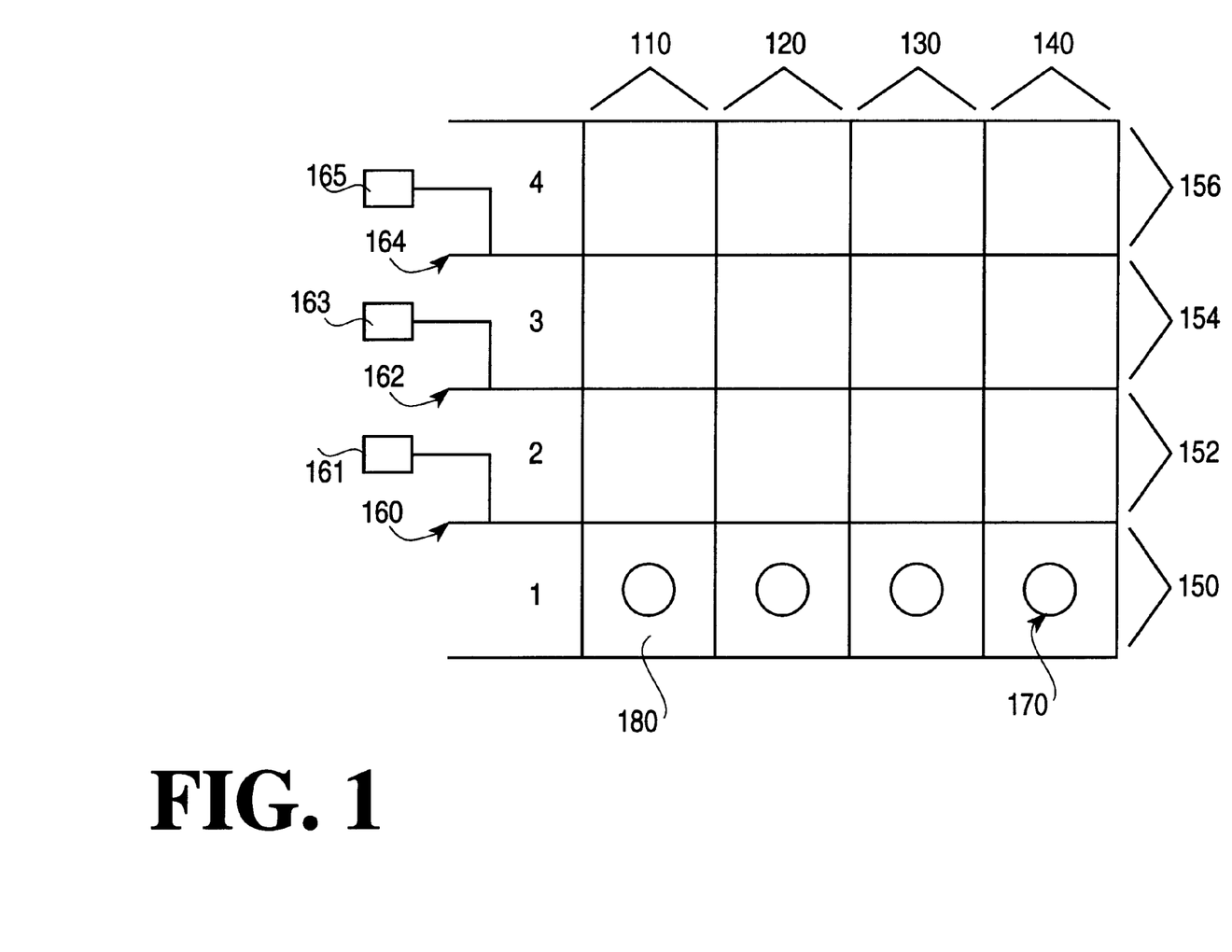
FIG. 1 illustrates one embodiment of an erased state for a block of multi-level memory cells.
Figure 2:
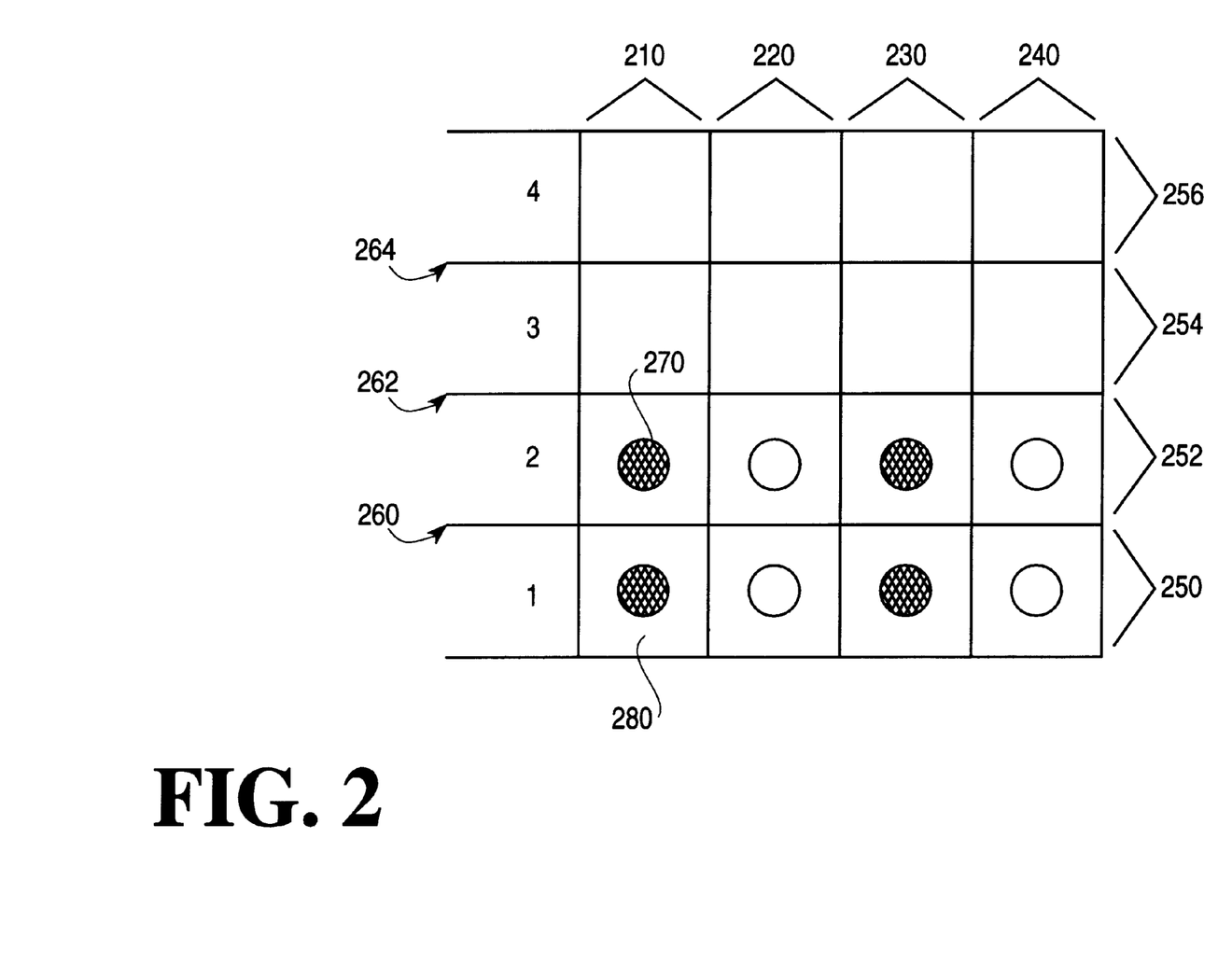
FIG. 2 illustrates the programming of a level within a block of multi-level memory cells.
Figure 3:
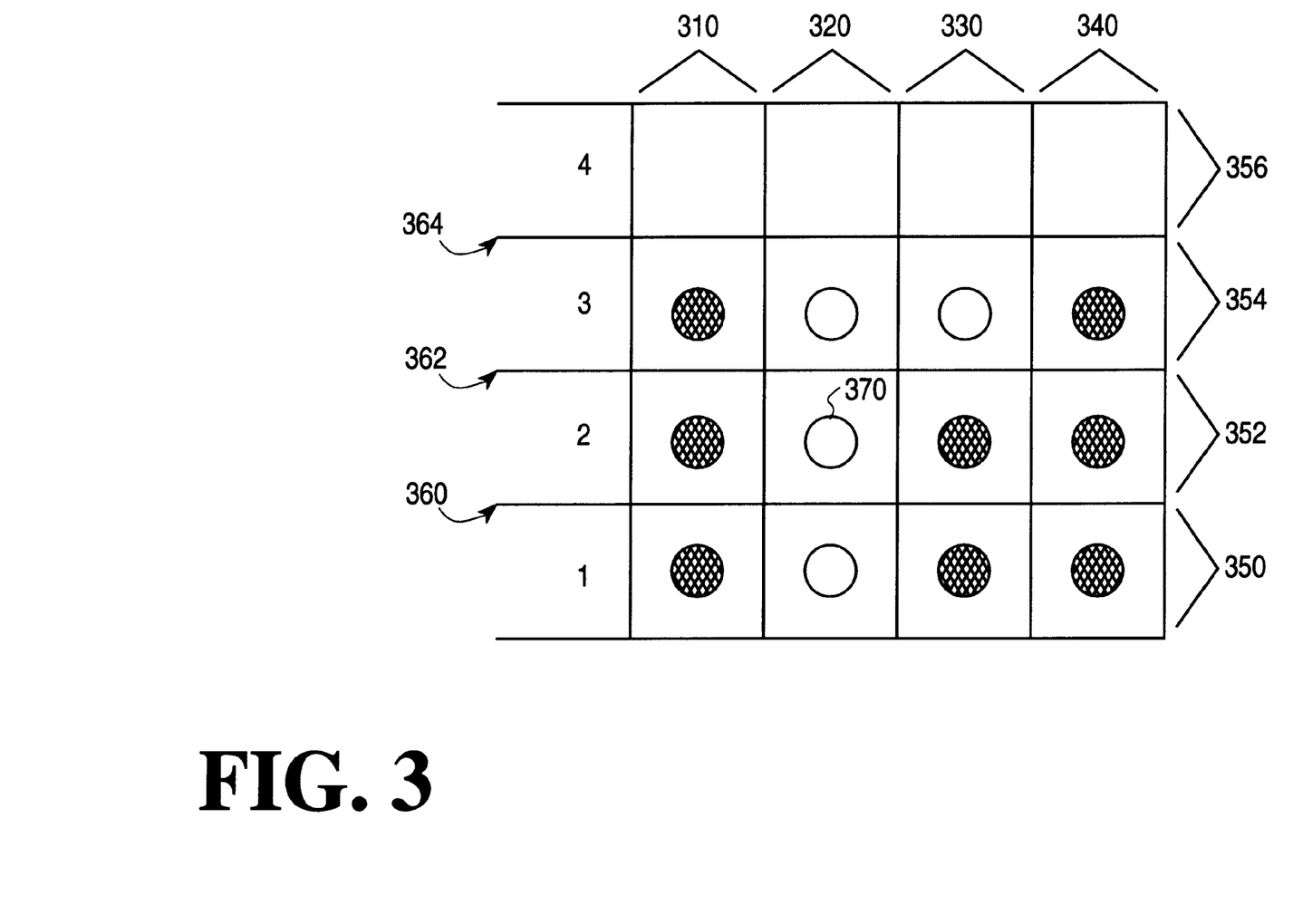
FIG. 3 illustrates the programming of another level within a block of multi-level memory cells.

FIGS. 1–3 serve to illustrate the result of performing multiple writes to four 4 level cells. FIG. 1 illustrates a group of erased multi-level cells 110, 120, 130, and 140. FIG. 2 illustrates writing the sequence "0101" to the cells. FIG. 3 illustrates subsequently writing a "0110". (The filled in circles represent charge placed on the floating gates and placing charge on the floating gates is associated with a logic "0".) These figures do not illustrate separation ranges, however, referring back to FIG. 1, the reference voltages discussed above correspond to dividing lines 160, 162, and 164 and are used to determine the values stored in cells 110, 120, 130, and 140. The first level (150) represents the erased state. The empty circles (e.g., 170) indicate that the floating gates do not contain sufficient charge such that a threshold dividing levels 1 and 2 is exceeded. When cell 140 is sensed and the result compared to a reference voltage corresponding to dividing line 160, cell 140 will be determined to be erased (i.e., storing a "1" at level 1) because there is insufficient charge to exceed the threshold set by dividing line 160. In actuality, charge may exist (i.e., filled in circles or partially filled in circles could appear) at level 1 as long as the charge level does not exceed the threshold of dividing line 160.

FIG. 2 illustrates storing "0101" (when viewed from left to right beginning with cell 210) to the previously erased cells. The "filled-in circle" or dot at a given level is intended to indicate that the floating gate for that cell has been charged to that level. For example, dot 270 at level 2 means that the floating gate of cell 210 has had sufficient charge placed on it so that when the reference voltage corresponding to 260 is used, the cell will be deemed to be storing a "0" at level 2 as opposed to being erased or storing a "1" at level 2. In other words, dot 270 implies that any voltage measured from cell 210 will be above the threshold of the reference voltage corresponding to dividing line 260.

In order to store the 0 at level 2 represented by dot 270, the amount of charge on the floating gate will exceed the threshold set for level 1. Thus dot 280 (corresponding to empty circle 180 in FIG. 1) will become a filled in circle if it was previously an empty circle as illustrated in FIG. 1.

FIG. 3 illustrates storing "0110" to the group of cells that were previously storing a "0101". Note that the floating gate of cell 310 continues to have charge placed on it and the floating gate of cell 320 does not yet have any charge placed on it. In this embodiment, cell 330 does not need to have any additional charge placed on it. The floating gate of cell 340, however, must have sufficient charge placed on it to bring it up through levels 1 (350) and 2 (352). Because cell 340 did not previously have any substantial amount of charge on the floating gate, a greater amount of time and energy will be required at this point to add the appropriate amount of charge. Now that level 3 (354) is being used, a level indicator must be set so that the appropriate dividing line (i.e., reference voltage) is now used.

All of the reference voltages are used to determine the multi-bit value stored in a multi-level cell used in the conventional manner as stated above. In this case, however, the current level indicated by the level indicator dictates which one of the reference voltages should be used.

Level 3 has not been used and thus is available for writing to. Thus, for an n-level multi-level cell—up to n−1 writes can be performed before an erase operation. The multi-level memory cell can be written to more than one time before performing an erase operation as follows: First, a first bit is stored at a first level of an n-level multi-level memory cell. In order to know the proper reference voltage to use when reading the cell, a level indicator must be set to indicate this first level. When a second, superseding bit is to be written to the cell, the second bit is stored at a second level of the n-level memory cell. The level indicator is then updated to indicate that the second level of the cell is now being used.

The multi-level memory cell can be pseudo-erased and made available for storing a value by incrementing the level indicator so that the level indicator indicates the next level of the multi-level cell to be written to. This procedure can be performed up to n−1 levels before an actual erase is required.

Consider a solid state disk as one application of the multiple write before erase implementation of the multi-level memory cell. Although flash cells are programmed one at a time, flash cells can typically only be erased a block at a time. A conventional binary cell can be individually programmed to a logical 0 at any time, however, once the cell is programmed to a logical 0 it must be erased in order to store a logical 1. Thus if a bit associated with a binary cell within a block must change from a 0 to a 1, the whole block must be erased before that cell can store a 1 again.

In one embodiment, the "valid" information and the updated information are copied to a free area of the flash memory. The old block location is marked for cleanup so that its storage space can be erased and freed up for future storage. This permits deferring the erase procedure which tends to improve performance of the solid state disk.

The erase operation tends to require more time and more energy than the programming operation. A reduction in the execution time of either operation can improve the performance of the system. If multi-level cells are used instead of the conventional binary cell, the pseudo-erase operation might be accomplished by simply incrementing the level indicator for the block of cells concerned. Although a true erase has not been performed, this technique permits deferring the erase operation until after the block has been written to n−1 times for a block of n-level multi-level cells. This technique has the potential to save energy and erase time. Because an actual erasure has not occurred, energy otherwise exerted during the normal erase operation is conserved except for the amount required to increase a level indicator for the block of memory cells. The only time required is that needed to increment the level indicator for the block. Thus the use of this technique can save energy and time and thus has the potential for improving solid state disk performance.

An additional technique that might enhance system performance would be to "backfill". This technique recognizes that programming a bit to a "0" at the qth level of a cell might take different times dependent upon whether the previously stored bit was a "1", or a "0". In other words the amount of time required to program the cell at a particular level is directly related to the amount of charge already on the floating gate.

Figure 4:
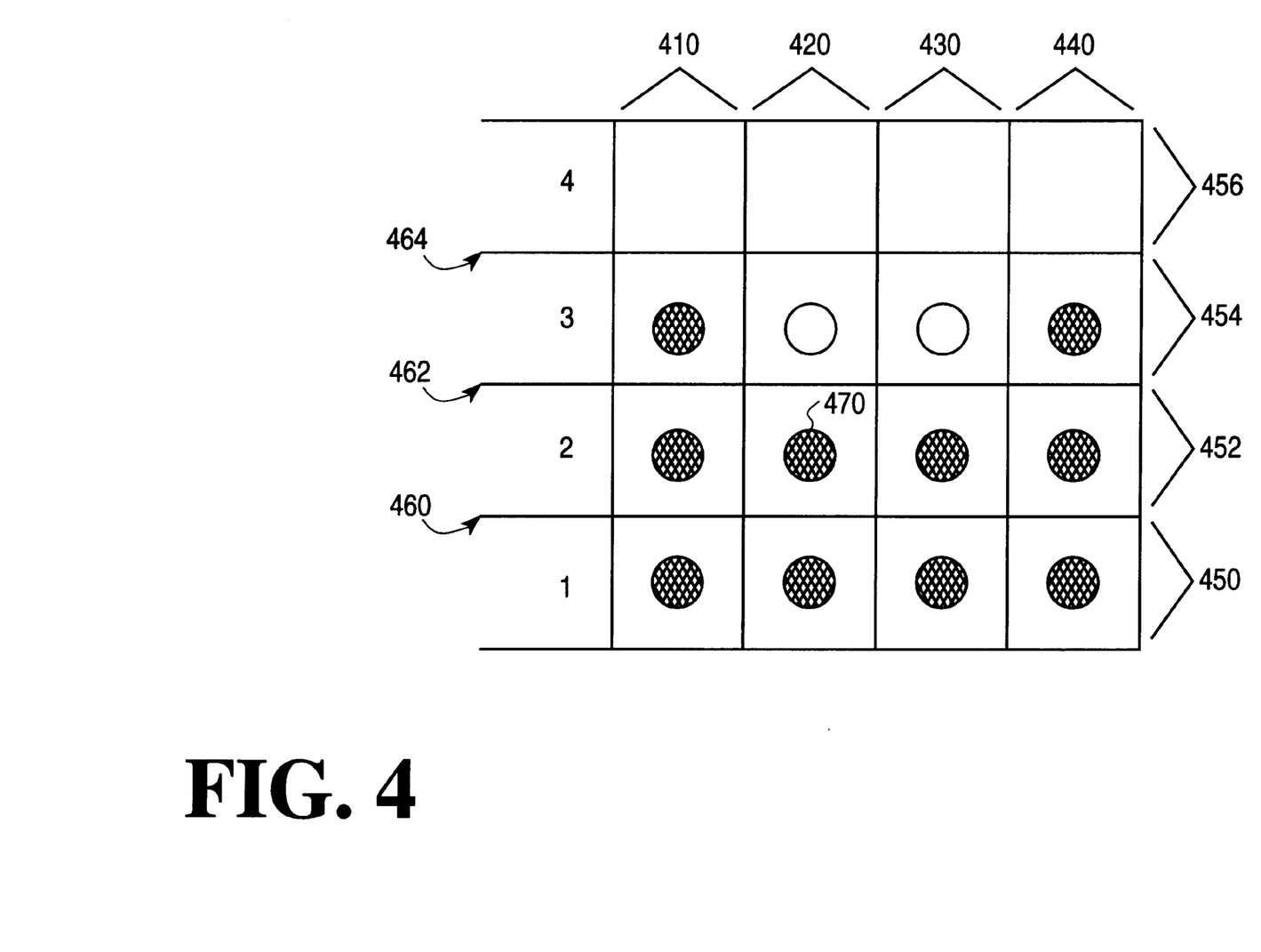
FIG. 4 illustrates the programming of a level of the multi-level memory cell using a "backfill" technique.

FIG. 4 illustrates an alternative to FIG. 3 using the backfill technique. Note that in writing to level 3 in FIG. 3, cell 320 still has substantially no charge on the floating gate due to the fact that three "1"s have been written to the cell. If a "0" is to be written at level 4, more time will be required to program cell 320 to a "0" than will be required to program cell 310 to a "0" due to the amount of charge already on the floating gate of cell 310. Thus the programming operation is sensitive to the value previously stored in the multi-level cells. FIG. 4, however, illustrates the same value stored in level 3 as was stored in FIG. 3. The difference is that the preceding first and second levels are now programmed to a "0" before proceeding to the next level. Note that 370 of FIG. 3 is an empty circle and 470 of FIG. 4 is a filled circle, yet the value stored at level 3 is the same in both figures.

The backfill technique helps to ensure that programming the cell to a "0" at any level takes approximately the same amount of time. This technique does have the disadvantage that time and energy are required to add charge to the floating gate whenever the level indicator is incremented.

The advantages of using this technique, however, include consistent programming times at subsequently higher levels that are substantially independent of the current value stored in the multi-level cells. Referring back to FIG. 1, consistent with the backfill technique, the floating gates of four cells could be charged up to (but not exceeding) threshold 160. Thus 170 and 180 and the other circles would be filled-in to represent the charge presence. Level 1 would still represent the erased state, however, the programming of level 2 will now require less time because of the amount of charge already on the floating gates.

The examples presented above illustrate performing multiple superseding writes to a memory without having to perform an erase operation between write operations. In particular, up to n−1 single bit writes without an erase can be performed on a multi-level cell having at least n levels.

Figure 5:
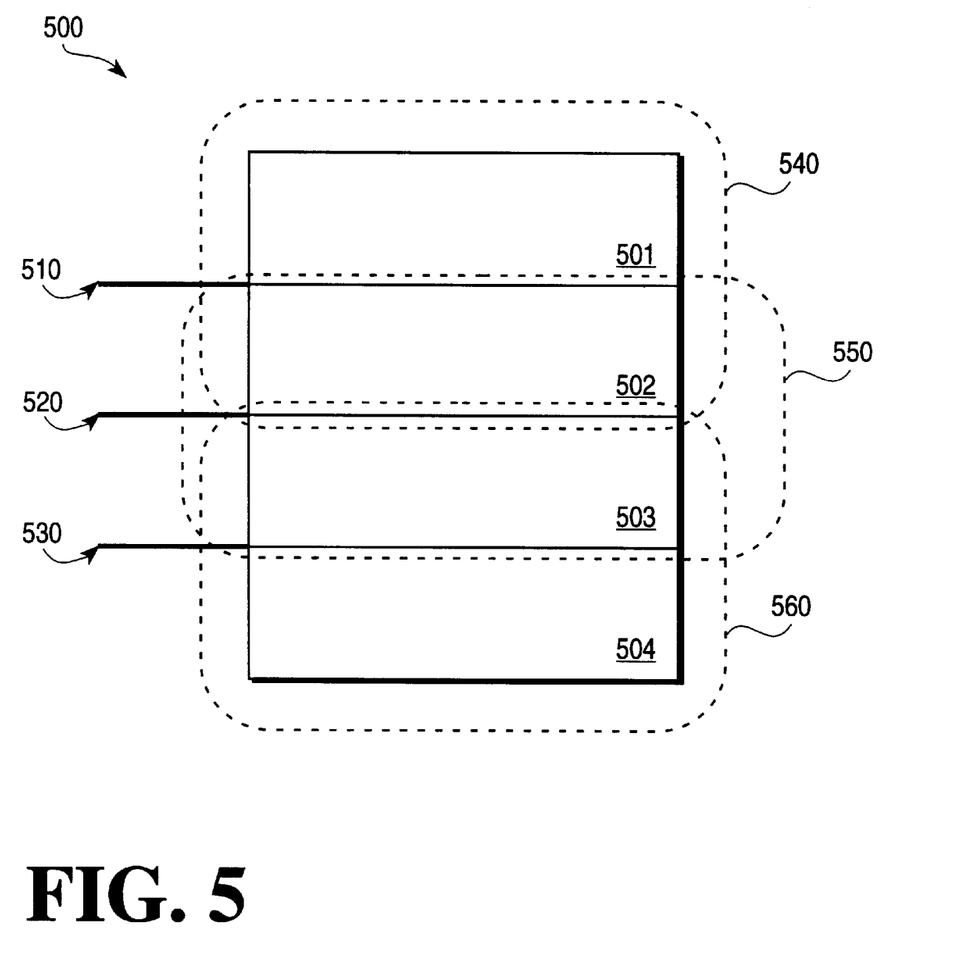
FIG. 5 illustrates four levels of a multi-level memory cell.

FIG. 5 is useful for deriving a generalized expression for the number of writes that can be performed without an erase for a multi-level cell having n levels. FIG. 5 illustrates multi-level cell 500 which has 4 levels—501, 502, 503, and 504. In order to store m bits, $2^m$ levels are required. Thus, for example, two levels are required to store a single bit. In order to store a first single bit, charge will be placed in level 504 or levels 503 and 504 so that reference 530 can determine whether a 1 or a 0 is stored after a first write operation. Each reference can determine one of two states from two associated levels. Reference 530 is associated with levels 503 and 504 as indicated by 560. Reference 520 is associated with levels 502 and 503 as indicated by 550. Reference 510 is associated with levels 501 and 502 as indicated by 540. Thus 540, 550, and 560 represent groups of levels associated with superseding writes such that 550 is a superseding write group to 560 and 540 is a superseding write group to 550.

Although each write operation requires $2^m$ levels per bit, a subsequent write operation uses the highest level of the previously written bit(s) to represent the lowest level of the subsequently written bits. Thus at least one level of the levels required for a subsequent write operation is effectively overlapped with the one level of the levels required for a previous write operation so that only $2^m-1$ additional levels are required to write the subsequent set of bits. Referring to FIG. 5, this is evidenced by the intersection between two adjacent write groups. Thus write groups 560 and 550 each require two levels, however, level 503 is used by both write groups so that only one additional level is needed to support two write groups. Thus the number of additional levels required to represent m bits for a given subsequent write operation is $2^m-1$.

Figure 6:
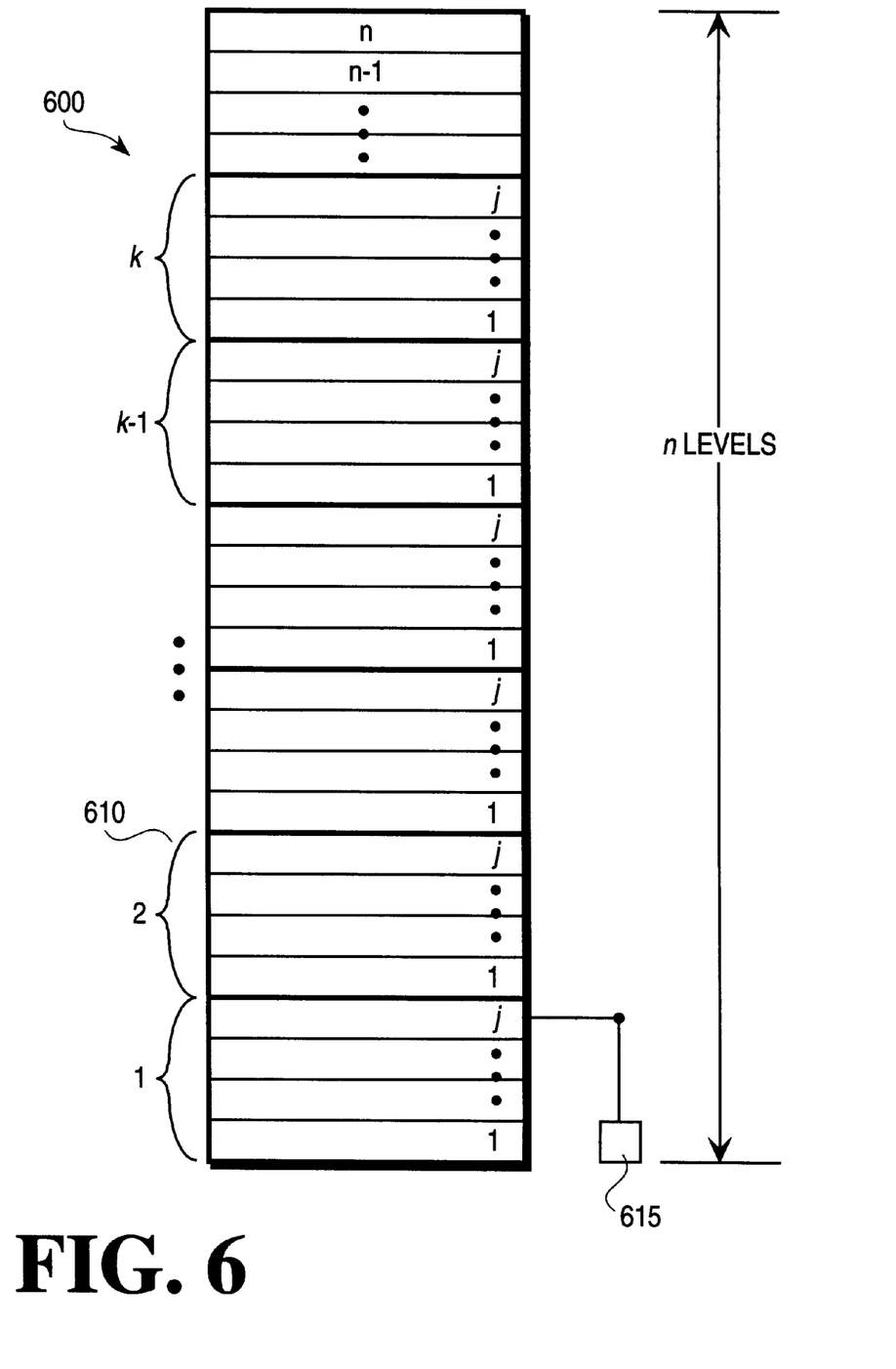
FIG. 6 illustrates one embodiment of a multi-level memory cell having n levels grouped into k groups of j levels.

FIG. 6 illustrates a multi-level cell 600 having n levels. The n levels are grouped into k groups of j levels. In order for each group of levels to be able to store an m bit value, $j \geq 2^m$. Each group (610) of j levels may also be referred to as a write group and can be identified by a group indicator (615).

Assuming an efficient utilization of cell storage levels so that each group can store one m bit value without wasting any levels, $j=2^m$. Otherwise the number of bits that can be stored per write group is $int(log_2(j))$. The result of the function $int(x)$ is the integer component of x. Thus for example, $int(5/3)=1$. The result of the function $log2(x)$ is the logarithm (base 2) of x such that if $x=2^a$, then $log_2(x)=a$. In one embodiment j is an integer power-of-two so that $j=2^m$.

The method of performing multiple writes without an erase can be generalized to performing k writes wherein an m bit value is written for each write. In the general case, there are k groups of levels available for writing (i.e., k write groups). Each write group subsequent to the first write group shares a level with a preceding write group. The first write group requires $2^m$ levels. Each of the next k−1 write groups requires $2^m-1$ additional levels. This enables determination of n, the total number of levels required to allow k writes of an m bit value without performing an erase.

In order to write up to k superseding m bit values to a memory cell wherein each subsequent write supersedes an m bit value stored by a preceding write operation, the memory cell must have n levels where $$n \geq k(2^m-1)+1.$$

The variable k indicates the maximum number of write operations to be performed before an erase operation is required. Solving for k yields:

$$k \leq \frac{n-1}{2^m-1}$$

Applying this equation to the single bit case (i.e., m=1) yields k=n−1 which is in agreement with the single bit examples presented above.

The variables n and m can be chosen such that k is not an integer. In one embodiment, however, partial writes are not permitted so that k must be an integer. Given that $int(x) \leq x$ (for x>0), the variable k can be selected as any integer as long as $$k \leq int\left(\frac{n-1}{2^m-1}\right) \leq \frac{n-1}{2^m-1}$$

In one embodiment, at least one of n and m is not an integer. In another embodiment n and m are integers and are chosen such that $$k = int\left(\frac{n-1}{2^m-1}\right) = \frac{n-1}{2^m-1}$$

Unlike the single bit case, there is not a one-to-one correspondence between voltage references and write groups when multiple bits are written (i.e., m>1). In order to determine one of $2^m$ states from each write group, $2^m-1$ references will be required. Thus a given write group is now associated with $2^m-1$ references. (Note that for the single bit case, m=1 and $2^m-1=2^1-1=1$ reference so that there is a one-to-one correspondence between references and write groups.)

Once an m bit value has been written to a given write group, a superseding m bit value can be written to the multi-level cell without performing an erase by writing to the next write group. In other words, a method of writing to a memory cell includes the step of writing a first m bit value to a first write group of the memory cell. A superseding second m bit value is written to a second write group of the memory cell.

A group indicator can be used analogous to the level indicator presented above with respect to the single bit case. The group indicator is used to determine which of the k groups is being used to store an m bit value. The group indicator also indicates the number of writes that have already been performed without an erase. Instead of advancing a single level to store a value, the group indicator is adjusted so that the next available write group for a subsequent superseding write of an m bit value can be determined.

In one embodiment the group indicator is incremented to identify the next write group available for a subsequent superseding write.

Thus one method of writing to a memory cell includes the steps of storing m bits in a first group of levels of the memory cell, adjusting a group indicator to identify the next available group, and storing m subsequent superseding bits in a second group of levels of the memory cell, without erasing the memory cell.

Once k write operations have been performed, the memory cell must be physically erased before additional write operations can be performed. The group indicator will have to be adjusted depending upon whether a full physical erasure or partial physical erasure is permitted.

In one embodiment, a partial physical erase is permitted. In a partial physical erase, the charge stored within one write group of the memory cell is removed until no charge remains within that one write group. In such a case, the group indicator should be initialized depending upon how many write groups are erased. If the current write group is write group i and enough charge is removed to erase b write groups, then the group indicator must be decremented or initialized to i−b. In other words, a partial erase can be accomplished by removing charge from an n-level memory cell having k write groups such that write groups k−b (wherein b<k) through k are storing substantially no charge.

If in an alternative embodiment, however, only full physical erasures are permitted, then substantially all charge is removed from the multi-level memory cell during a physical erase operation. In such a case, the group indicator should be initialized so that after the full physical erase operation the group indicator points to the first of the k available groups within the memory cell.

As with the examples presented above with respect to the single bit erase, the memory cell appears to be erased from an m bit viewpoint when the group indicator is properly adjusted. When the group indicator is adjusted to identify an available set of $2^m$ adjacent levels of the memory cell, the memory cell appears to be erased from the m bit viewpoint. Effectively, however, a true erase is deferred for k write operations. Thus the memory cell is "erased" by advancing the group indicator to the next available set of $2^m$ adjacent levels. After k writes, however, the memory cell will have to be fully erased before another value can be stored in the memory cell.

A read operation uses the group indicator to determine which set of $2^m$ levels need to be sensed in order to determine the m bit value stored in the memory cell. Because each set of $2^m$ levels requires $2^m-1$ references, the group indicator effectively identifies which set of $2^m-1$ references are used to determine the m bit value stored in the memory cell. Thus the group indicator is provided to identify $2^m$ adjacent levels of the memory cell. An m bit value is then read from the memory cell by determining the state of the $2^m$ adjacent levels.

The backfill technique presented above with respect to storing single bits is similarly applicable to storing multiple bits. In particular, backfilling is accomplished by storing a predetermined value in the first write group before storing m superseding bits in a second write group.

Using an n-level multilevel memory cell to perform multiple writes of an m-bit value (wherein $m \geq 1$) permits a reduction in the total number of sense amplifiers required for sensing the value stored in the memory cell. All the voltage references within a given write group are required for sensing the value stored within that write group. Under normal operation, however, all n levels belong to the same write group so that the n-level cell is used to store a value having $\log_2(n)$ bits. Thus the cell must be erased before a new value may be programmed into the cell. In order to read the contents of the cell all n−1 voltage references are simultaneously needed. If, however, each write group consists of $2^m$ levels, then only $2^m-1$ voltage references are needed for each sensing operation. As long as $2^m<n$, this means that fewer than n−1 sense amplifiers are needed for each sensing operation.

The total number of sense amplifiers required to read the memory cell can be reduced from n−1 to approximately $2^m-1$, if programmable sense amplifiers are used. Typically a sense amplifier is a comparator that compares the sensed value with a reference voltage. Referring to FIG. 1, three sense amplifiers 161, 163 and 165 are required with corresponding reference voltages established at 160, 162, and 164 in order to determine the values stored in cells 110, 120, 130, and 140. Referring to FIG. 6, only the sense amplifiers required to read a current write group are needed for a given read operation. In order to read the next write group, the same $2^m-1$ sense amplifiers can be used, if the reference voltage for each sense amplifier is adjusted $2^m$ levels. The effect is to shift the reference voltages of all $2^m-1$ sense amplifiers to correspond to the reference voltages needed to read the m bit value stored in the next write group.

In one embodiment, $2^m-1$ programmable sense amplifiers are used to read an m bit value stored in a first group of $2^m$ adjacent levels. The same $2^m-1$ programmable sense amplifiers are reprogrammed to read an m bit value stored in a second group of $2^m$ adjacent levels. The reference voltage level programmed for a given sense amplifier is determined from a programmable value. In one embodiment, the programmable value is the group indicator. Thus the reference voltage for a given sense amplifier is adjusted $2^m$ levels each time the group indicator is incremented or decremented.

Thus another method of reading an m bit value from a multi-level memory cell is described. A first group of $2^m$ adjacent levels of the memory cell are identified. The first group is sensed using a first set of $2^m-1$ sense amplifiers. A second group of $2^m$ adjacent levels of the memory cell are then identified. The second group is sensed using the same first set of $2^m-1$ sense amplifiers. In one embodiment, the $2^m-1$ sense amplifiers are programmed in accordance with the group indicator, wherein a reference voltage (or reference level) of each sense amplifier is adjusted $2^m$ levels each time the group indicator is incremented or decremented. Thus in one embodiment, the reference level of each of the $2^m-1$ sense amplifiers is incremented $2^m$ levels, if the group indicator is incremented. Similarly, the reference level of each of the $2^m-1$ sense amplifiers is decreased $2^m$ levels, if the group indicator is decremented.

Although flash memory has been used in the examples presented above, these methods are applicable to any memory that permits the successive storing of charge during subsequent programming operations and the sensing of successive variable amounts of charge (i.e., positive or negative variations in charge). Examples of such memories include non-multi-level flash memory cells (non-MLC flash), electrically erasable programmable read only memory (EEPROM), erasable programmable read only memory (EPROM), read only memory (ROM), and multi-level flash (MLC flash) cells as described above.

In the preceding detailed description, the invention is described with reference to specific exemplary embodiments thereof. Various modifications and changes may be made thereto without departing from the broader spirit and scope of the invention as set forth in the claims. The specification and drawings are, accordingly, to be regarded in an illustrative rather than a restrictive sense.

What is claimed is:

1. A method of writing to a memory cell comprising the steps of:
storing m bits in a first group of levels of the memory cell, wherein m is greater than or equal to two;
storing m superseding bits in a second group of levels of the memory cell, without erasing the memory cell; and
adjusting a group indicator to identify the second group.

2. The method of claim 1 wherein the memory cell is a nonvolatile memory cell.

3. The method of claim 2 wherein the memory cell is a flash memory cell.

4. The method of claim 1 wherein the memory cell is a multi-level cell having at least n levels, wherein n is greater than or equal to two, and the n levels include k groups, wherein k is greater than or equal to two, each group including j of the n levels.

5. The method of claim 4 wherein $j \geq 2^m$.

6. The method of claim 5 wherein $j=2^m$.

7. The method of claim 4 wherein m, k, and n are integers.

8. The method of claim 7 wherein $$k = \frac{n-1}{2^m - 1}.$$

9. The method of claim 1 wherein the first and second groups of levels overlap to include at least one level in common.

10. The method of claim 1 further comprising the step of storing a predetermined value in the first group of levels before the step of storing m superseding bits in a second group of levels.

11. A method of reading a memory cell comprising the steps of:
reading a value stored in a group indicator;
identifying a group of adjacent levels of an n level memory cell based on the value stored in the group indicator, wherein n is greater than or equal to two; and
sensing the group to read an m bit value.

12. The method of claim 11 wherein the memory cell is a nonvolatile memory cell.

13. The method of claim 11 wherein the memory cell is a flash memory cell.

14. A method of reading a memory cell comprising the steps of:
reading a value stored in a group indicator;
identifying a first group of $2^m$ adjacent levels of the memory cell based on the value stored in the group indicator, wherein m is greater than or equal to two;
sensing the first group using a first set of $2^m-1$ sense amplifiers to read an m bit value;
identifying a second group of $2^m$ adjacent levels of the memory cell based on the value stored in the group indicator; and
sensing the second group using the same first set to read another m bit value.

15. The method of claim 11 wherein the sensing steps further comprise the step of:
setting a reference level of each of the $2^m-1$ sense amplifiers in accordance with the group indicator.

16. The method of claim 15, further comprising the step of:
increasing the reference level of each of the $2^m-1$ sense amplifiers $2^m$, if the group indicator is incremented.

17. The method of claim 15, further comprising the step of:
decreasing the reference level of each of the $2^m-1$ sense amplifiers $2^m$ levels, if the group indicator is decremented.

18. A method of writing to a memory cell comprising the steps of:
a) storing m bits in a first group of levels of the memory cell;
b) adjusting a group indicator to identify a subsequent group of levels of the memory cell;
c) storing m superseding subsequent bits in the subsequent group of levels, without erasing the memory cell, wherein m is greater than or equal to two; and
d) repeating steps b) and c).

19. The method of claim 18 further comprising the steps of:
e) erasing the memory cell; and
f) initializing the group indicator.

* * * * *

UNITED STATES PATENT AND TRADEMARK OFFICE
CERTIFICATE OF CORRECTION

PATENT NO. : 5,936,884  
DATED : August 10, 1999  
INVENTOR(S) : Hasbun et al.

It is certified that error appears in the above-identified patent and that said Letters Patent is hereby corrected as shown below:

Column 12,
Line 15, delete "claim 11" and insert -- claim 14 --.

Signed and Sealed this

Twenty-ninth Day of July, 2003

JAMES E. ROGAN
*Director of the United States Patent and Trademark Office*